United States Patent
Jain et al.

(10) Patent No.: US 7,436,727 B2
(45) Date of Patent: Oct. 14, 2008

(54) METHOD AND APPARATUS TO CONTROL A POWER CONSUMPTION OF A MEMORY DEVICE

(75) Inventors: Sandeep K. Jain, Milpitas, CA (US); Animesh Mishra, Pleasanton, CA (US); Jun Shi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 353 days.

(21) Appl. No.: 10/956,289

(22) Filed: Sep. 30, 2004

(65) Prior Publication Data
US 2006/0067150 A1   Mar. 30, 2006

(51) Int. Cl.
*G11C 7/00* (2006.01)
*G11C 7/04* (2006.01)

(52) U.S. Cl. ...................... 365/222; 365/211
(58) Field of Classification Search .............. 365/222, 365/211
See application file for complete search history.

(56) References Cited

U.S. PATENT DOCUMENTS

| | | | | |
|---|---|---|---|---|
| 5,903,506 A | * | 5/1999 | Blodgett | 365/222 |
| 6,199,139 B1 | * | 3/2001 | Katayama et al. | 365/222 |
| 6,556,496 B2 | * | 4/2003 | Benedix et al. | 365/222 |
| 6,603,696 B2 | * | 8/2003 | Janzen | 365/222 |
| 6,628,560 B2 | * | 9/2003 | Dosaka | 365/222 |
| 6,778,458 B2 | * | 8/2004 | Tsern et al. | 365/222 |
| 6,781,908 B1 | * | 8/2004 | Pelley et al. | 365/222 |
| 6,970,393 B1 | * | 11/2005 | Cho et al. | 365/222 |

* cited by examiner

*Primary Examiner*—Trong Phan
(74) *Attorney, Agent, or Firm*—Blakely, Sokoloff, Taylor & Zafman LLP

(57) ABSTRACT

In one embodiment, a method is provided. The method comprises upon entering a self-refresh mode, refreshing memory cells in a memory device at a first refresh frequency; and upon a predefined event refreshing the memory cells at a second refresh frequency, while in the self-refresh mode.

16 Claims, 7 Drawing Sheets

METHOD AND APPARATUS TO CONTROL A POWER CONSUMPTION OF A MEMORY DEVICE

FIELD OF THE INVENTION

Embodiments of the invention relate to a method and apparatus to conserve the power consumption of a memory device such as a dynamic random access memory (DRAM).

BACKGROUND

Dynamic random access memory devices (DRAMs) include a memory array comprising a plurality of memory cells. Generally DRAM devices are coupled to a memory controller and are configurable to enter a self-refresh mode under certain conditions, e.g. when there is no memory cycles being issued by the memory controller.

In the self-refresh mode, the memory cells are refreshed at a frequency (hereinafter "refresh frequency") that is set upon entry of the self-refresh mode. The refreshing of the memory cells during self-refresh mode is to prevent a loss of data from each memory cell due to capacitive leakage.

The refresh frequency is set based on a predicted temperature of the memory array. The predicted temperature may be predicted based on a volume of memory cycles issued by the memory controller to the memory device. Typically, the higher the predicted temperature, the higher the refresh frequency. This is because at higher temperatures a memory cell loses charge at a faster rate due to capacitive leakage.

However, once in self-refresh mode, the refresh frequency remains static or unchanged, even if the memory array cools to a level that the memory cells can be refreshed at a lower refresh frequency without data loss.

DETAILED DESCRIPTION

In the following description, for purposes of explanation, numerous specific details are set forth in order to provide a thorough understanding of the invention. It will be apparent, however, to one of ordinary skill in the art that the invention can be practiced without these specific details. In other instances, structures and devices are shown in block diagram form in order to avoid obscuring the invention.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
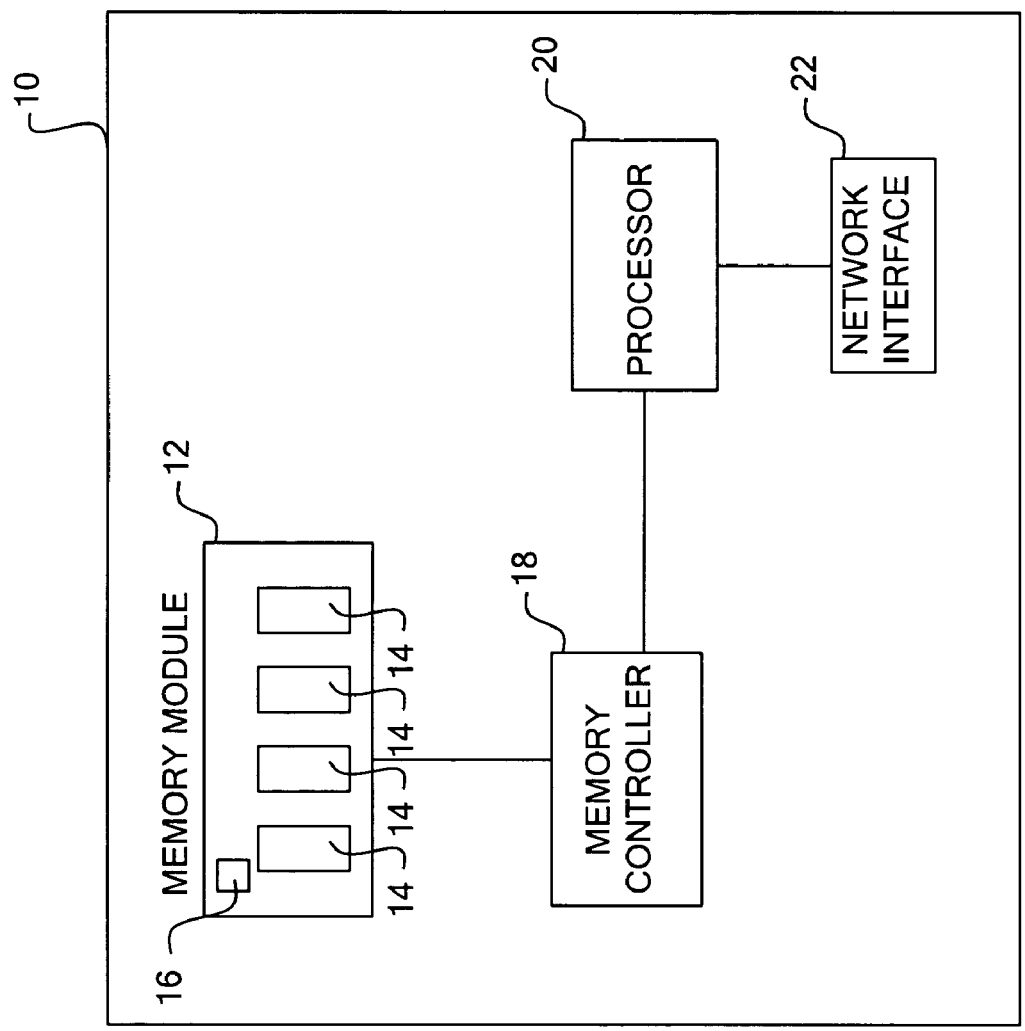
FIG. 1 shows a high-level block diagram of the system having a memory module, in accordance with one embodiment of the invention.

FIG. 1 of the drawing shows a high-level block diagram of a system 10, in accordance with one embodiment of the invention. The system 10 includes a plurality of memory modules 12, only one of which has been shown in FIG. 1 of the drawings. The memory module 12 includes a number of memory devices 14, only four of which have been shown in FIG. 1 of the drawings. The memory device 14 may be architected in accordance with any memory technology, and may, for example, include Dynamic Random Access Memory (DRAM) devices, Static Random Access Memory (SRAM) devices, Double Data Rate (DDR) DRAM devices, etc. Further, the memory device 14 may be used in various devices, for example, desktop computers, notebook computers, servers, handhelds, graphics cards, etc. In one embodiment, the memory device 14 may be coupled to form an array of memory device 14 mounted on a printed circuit board. As will be seen, the memory module 12 also includes a temperature sensor 16, which will be descried in greater detail below. The memory module 12 is coupled to a memory controller 18 via a communications path, which in one embodiment may be a bus, or a high-speed data link. The memory controller 18 bridges communications between a processor 20 and the memory module 12. The system 10 also includes a network interface 22 to facilitate communications with a network.

Figure 2:
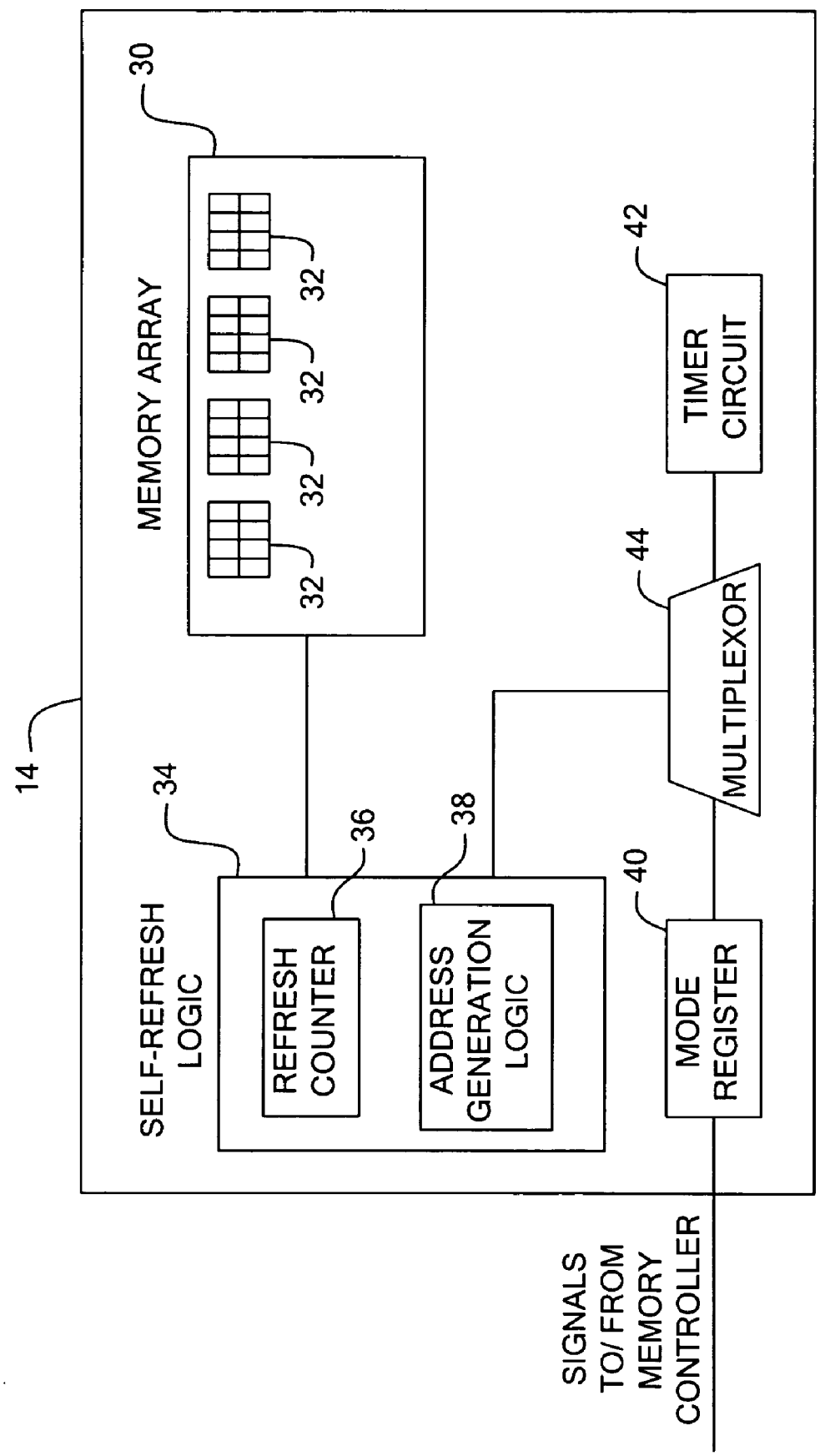
FIGS. 2 and 3 show embodiments of a memory device forming part of the memory module of FIG. 1.

Turning now to FIG. 2 of the drawings, the components of the memory devices 14 of FIG. 1, in accordance with one embodiment of the invention, are shown in greater detail. As will be seen, each memory device 14 includes a memory array 30 which is defined by a plurality of memory cells. In the example of FIG. 2, the memory cells are arranged to form four banks of cells. Each bank is indicated by reference numeral 32 in FIG. 2. One of ordinary skill in the art will appreciate that the particular number of banks of cells, and the arrangement of the cells may vary in accordance with different embodiments of the invention. Typically, each cell is capable of holding a charge representing a bit of data. In one embodiment, each cell comprises a transistor and a capacitor.

The memory array 30 is coupled to self-refresh logic 34. The self-refresh logic 34 controls the refreshing of memory cells in the memory array 30 during a self-refresh mode. The purpose of refreshing the memory cells within the memory array 30 during the self-refresh mode is to prevent data loss due to capacitive leakages in the memory cells. In one embodiment, the self-refresh logic 34 includes a refresh counter 36, and address generation logic 38. During the self-refresh mode, when the refresh counter 36 expires, the address generation logic 38 generates an address for a row of memory cells within the memory array 30 and sends a refresh signal to the memory array 30 to cause the memory array 30 to refresh the memory cells within the row. Once the row of memory cells has been refreshed, the refresh counter 36 is reset. Upon expiry of the refresh counter 36, the address of the next row of memory cells to be refreshed is generated by the logic 38, and a control signal is sent to the memory array 30 to cause the next row of memory cells to be refreshed. In this manner, the self-refresh logic 34 generates refresh signals to cause successive rows of memory cells within the memory array 30 to be refreshed. Thus, each memory cell within the memory array 30 is refreshed.

Typically, a counter value for the refresh counter 36 is set by the memory controller 18. For example, the memory controller 18 may program a mode register 40 with the counter value for the refresh counter 36. However, once the memory device 14 enters the self-refresh mode, for the duration of the self-refresh mode, the counter value is static and does not change. The counter value chosen for the refresh counter 36 by the memory controller 18 is directly related to a predicted temperature of the memory device 14. For example, based on the volume and pattern of memory cycles issued by the memory controller 18 to the memory device 14, the memory controller 18 is able to predict the temperature of the memory device 14. Generally, the higher the predicted temperature of the memory device 14, the higher the counter value set by the memory controller 18. This is because at higher temperatures data loss due to capacitive leakage from the memory cells within the memory array 30 is also higher.

During the self-refresh mode, the memory controller 18 does not issue new memory cycles to the memory device 14, and thus it is to be expected that the memory device 14 will experience a drop in temperature due to inactivity. Given the anticipated drop in the temperature of the memory device 14, it is possible to refresh the memory cells within the memory array 30 at a lower refresh frequency as the temperature of the memory array drops. Thus, in accordance with one embodiment of the invention the memory device 14 includes a timing circuit 42 which forms one input to a multiplexer 44. As will be seen in FIG. 2 of the drawings, the multiplexer 44 includes a second input from the mode register 40. Based on the inputs from the timing circuit 42, and the mode register 40, the multiplexer 44 selects a counter value for the refresh counter 36. For example, in one embodiment of the invention, upon entry of the self-refresh mode, the multiplexer 44 sets or selects the counter based on the value set by the memory controller 18 in the mode register 40. However, after a certain predefined period of time has passed after entry into the self-refresh mode, as measured by the timing circuit 42, the multiplexer 44 selects a lower counter value for the refresh counter 36. For example, in one embodiment, after say 10 minutes into entry of the self-refresh mode, the multiplexer 44 sets a lower counter value for the refresh counter 36 thereby to effectively halve the refresh frequency at which a self-refresh logic 34 refreshes the memory cells within the memory array 30. It will be appreciated that since the refresh frequency at which the memory cells within the memory array 30 are refreshed is lower, the memory device 14 will consume less power.

In one embodiment, the timing circuit 42 may be configured to provide an input to the multiplexer 40 at several timing points after entry into the self-refresh mode. Upon each input from the timing circuit 42, the multiplexer 40 further reduces the counter value for the refresh counter 36.

Figure 3:
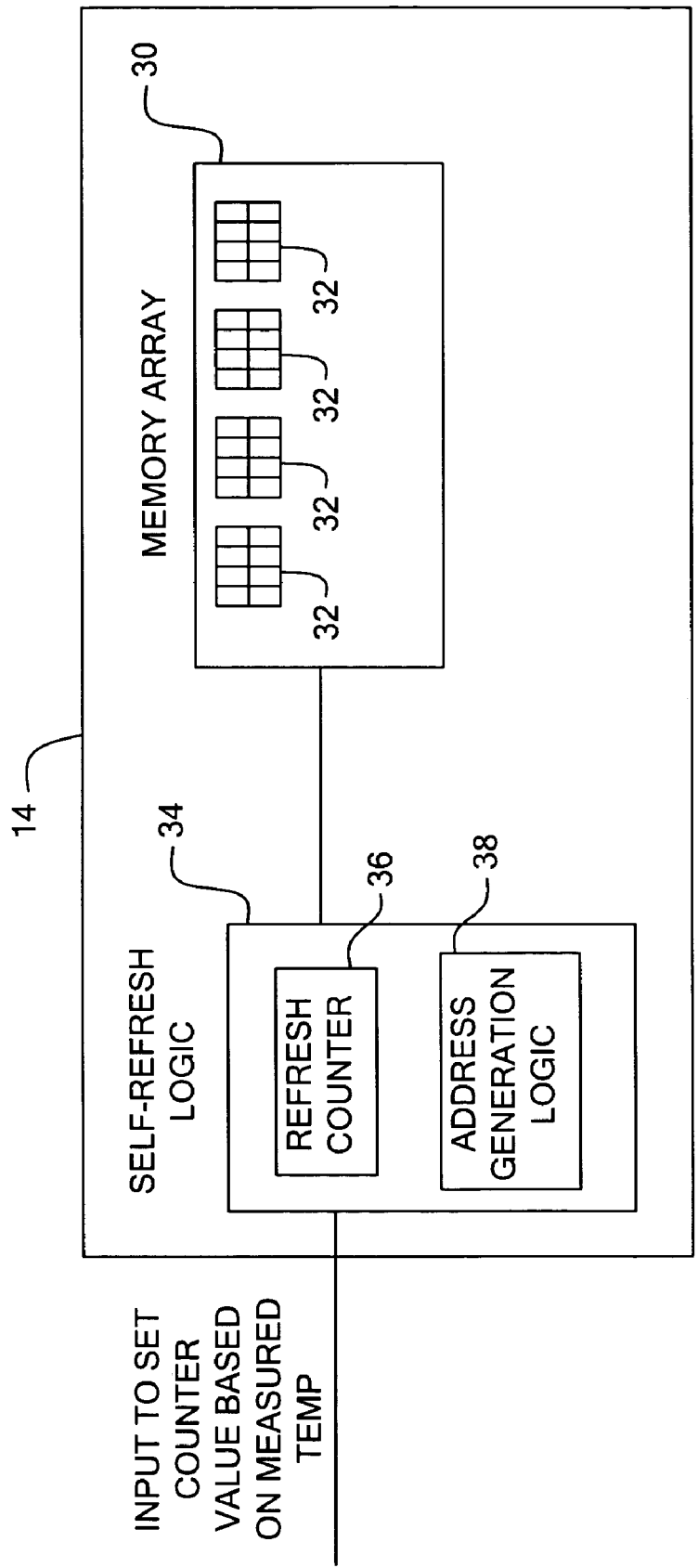

Referring now to FIG. 3 of the drawings, there is shown another embodiment of a memory device 14. Referring to FIG. 3 of the drawings, the memory device 14 includes many of the components of the memory device 14 shown in FIG. 2 of the drawings (these components are indicated by the same reference numerals used with respect to FIG. 2 of the drawings). However, instead of having a multiplexer 44 and a timing circuit 42, the refresh counter 36 receives input from the temperature sensor 16 (see FIG. 1 of the drawings). It is to be noted that although the temperature sensor 16 is shown as a separate component from the memory device 14, in one embodiment of the invention, the temperature sensor 16 may actually form part of the memory device 14. In the embodiment shown in FIG. 3 of the drawings, based on input from the temperature sensor 16, the counter 36 itself includes logic to select a counter value. In one embodiment, for a given drop in temperature of the memory device 14, as measured by the temperature sensor 16, the counter value for the refresh counter 36 is lowered by a matching or corresponding amount. Based on input from the temperature sensor 16, it will be appreciated that it is possible to dynamically change the counter value for the refresh counter 36 during self-refresh mode, so as to reduce the refresh frequency at which the memory cells within the memory array 30 are refreshed.

Figure 4:
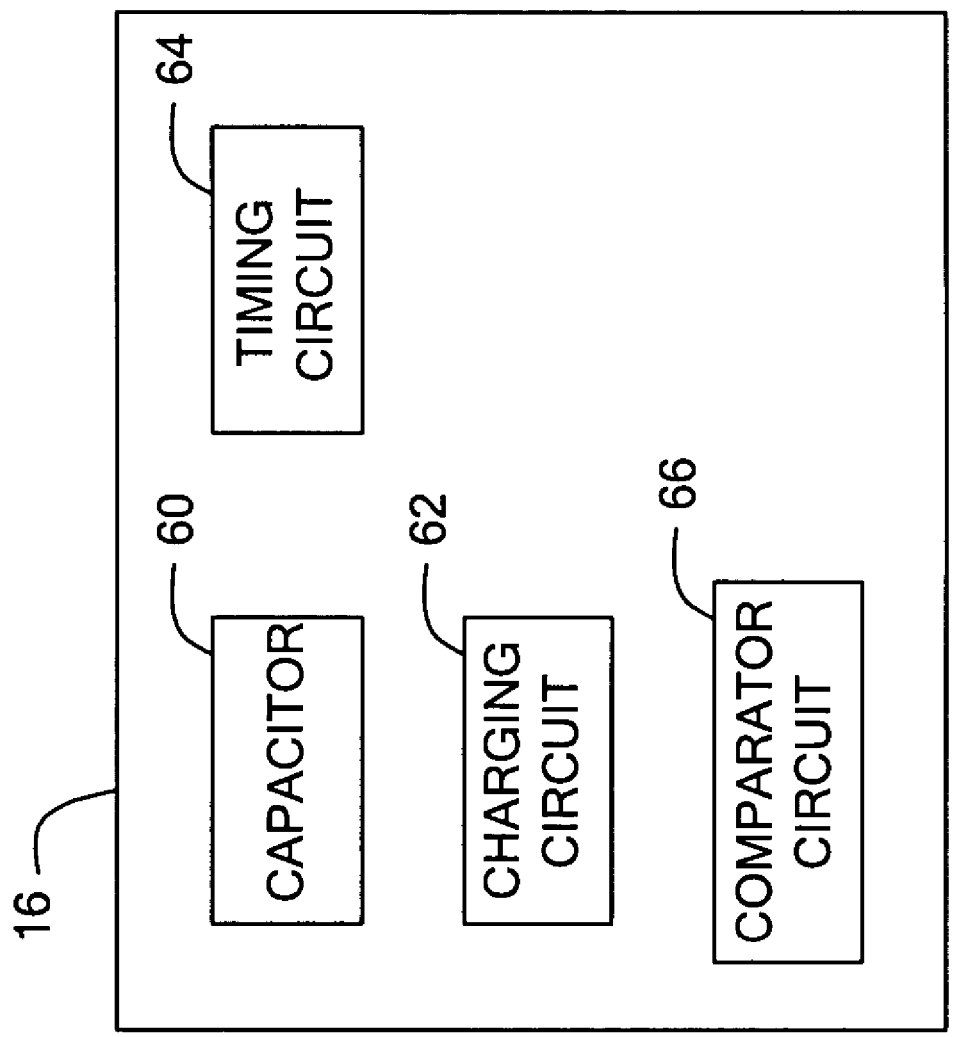
FIG. 4 shows the components of a temperature sensor, in accordance with one embodiment of the invention of FIG. 1.

Referring now to FIG. 4 of the drawings, there is shown a high-level block diagram of the components that form part of the temperature sensor 16, in accordance with one embodiment of the invention. As will be seen, the temperature sensor 16 includes a capacitor 60, a charging circuit 62, a timing circuit 64, and a comparator circuit 66. In one embodiment, the charging circuit 62 periodically charges the capacitor 60 with a charge so that the capacitor 60 has a potential of $V_C$. Over a period of time, the charge from the capacitor leaks or discharges until $V_C$ of the capacitor 60 is zero. In one embodiment, the timing circuit 64 includes a timer that counts down from a counter value which is initially set by the memory controller 18, through the mechanism of the mode register 40. For example, in one embodiment, the memory controller 18 may program the mode register 40 with the value of 78° Celsius. In this embodiment, the timing circuit 64 will countdown from a value say, X, which is a value that represents the time it will take for the capacitor 60 to discharge if the operating temperature of the memory device 14 were 78° Celsius. One of ordinary skill in the art would appreciate that if the operating temperature of the memory device 14 is greater than 78° Celsius then the capacitor 60 will discharge in a shorter time. Alternatively, if the operating temperature of the memory device 14 is less than 78° Celsius, then the capacitor 60 will take a longer time to discharge. Accordingly, in one embodiment, the comparator circuit 66 compares a signal indicative of the charge left in the capacitor 60, with a signal indicative of whether the timing circuit 64 has counted down to zero. Based on the foregoing, it will be seen that if the capacitor 60 has not discharged while the timing circuit 64 has already counted down to zero, then this indicates that the operating temperature of the memory device 14 is lower than the temperature set by the memory controller 18 upon entry of the self-refresh mode. It would be appreciated that in accordance with different embodiments of the invention, the temperature sensor 16 may be configured to provide an input to the refresh counter 36 based on a drop in temperature sensed by the sensor 16, and in response, the refresh counter 36 may select a lower counter value for the refresh counter thereby to effectively reduce the refresh frequency at which the memory cells within the memory array 30 are refreshed.

In one embodiment, the initial counter value for the timing circuit 64 of the temperature sensor 16 may be programmed by the memory controller 18 based on the predicted temperature for the memory device 14 for a given pattern of memory cycles issued to the memory device 14. As noted above, the starting counter value used by the timing circuit 64 is temperature dependent, and represents a measure of the time for the capacitor 60 of the sensor 16 to fully discharge given the predicted temperature for the memory device 14.

Figure 5:
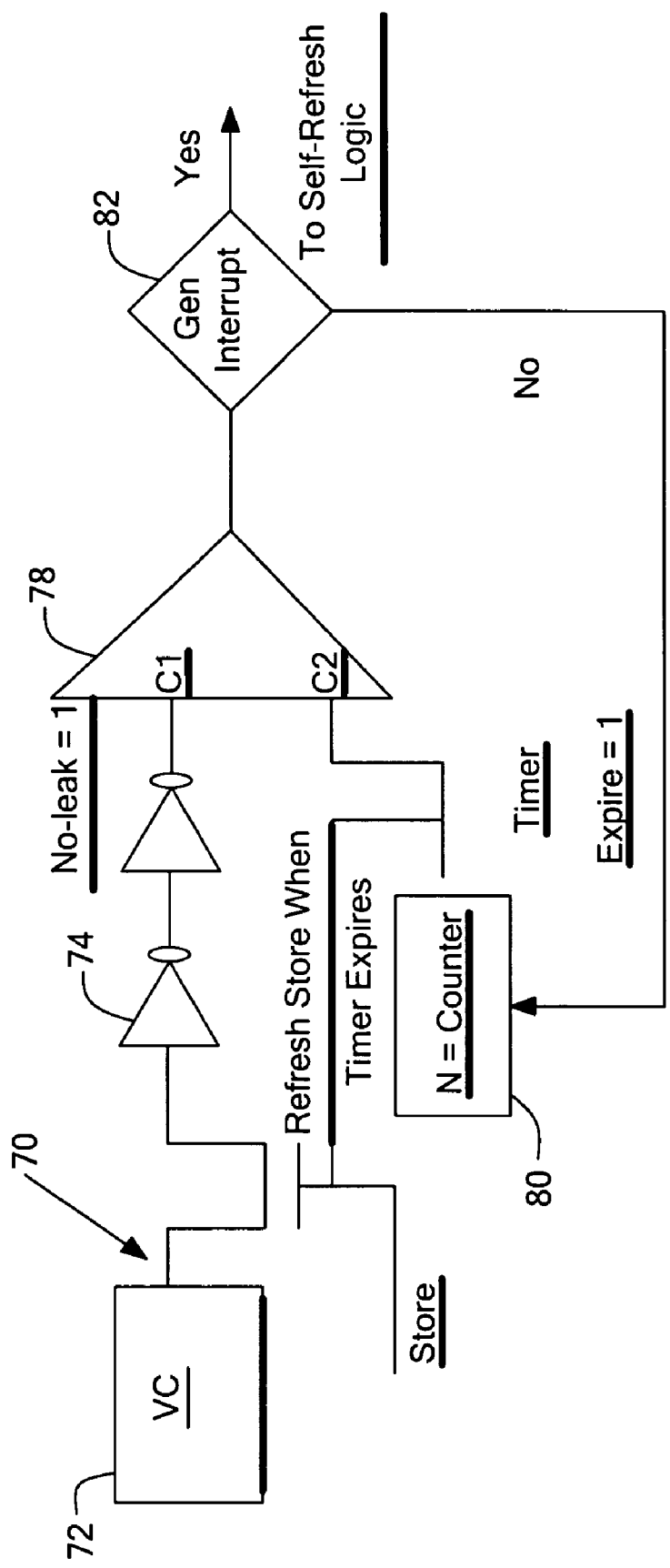
FIGS. 5 through 7 show flowcharts of operations performed by the memory module of FIG. 1, in accordance with one embodiment of the invention.

One of ordinary skill in the art, would appreciate that the various circuits of the memory device 14, are shown only functionally, and that in fact some of the circuits shown in the drawings may be incorporated into other circuits, or into a single circuit. FIG. 5 of the drawing shows one embodiment of a circuit that implements the functions of the temperature sensor 16. Referring to FIG. 5 of the drawings, the capacitor 60 of the temperature sensor 16 is modeled as a field-effect transistor, which is shown as an NMOS device 70 in FIG. 5. A voltage source 72 is connected to the "drain" of the NMOS device 70. When the "store" pin of the NMOS device 70 is toggled to logic value 1, the gate of the NMOS device 70 opens and a charge is transferred to the "source" of the NMOS device 70. Using this method, the NMOS device 70 is charged by the voltage source 72. An output of the NMOS device 70 is fed into a buffer device 74, which is connected to a comparator 78. In particular, the output of the buffer device 74 is connected to a pin C1 of the comparator 78. When the NMOS device 70 is charged, logic 1 is expected on the pin C1. When the NMOS device 70 is discharged, logic 0 is expected on the pin C1 of the comparator 78.

Once the NMOS device 72 is fully charged, the buffer device 74 detects the voltage as logic 1. When the NMOS device 70 leaks out charge over time, eventually the buffer device 74 would detect the voltage as logic 0. As the NMOS device 70 leaks the charge over time, a counting device (counter) 80 counts down from a stored counter value determined by the predicted temperature for the memory device 14. The output of the counter 80 is connected to the comparator device 78, in particular to pin C2 of the comparator device 78. When the counter 80 is still counting, in other words it has not yet expired, logic 0 is expected on the pin C2 of the comparator device 78. When the counter has expired, logic 1 is expected on the pin C2.

As will be seen, in process 82, a signal is generated if the counter 80 has expired (a condition indicated about logic 0 on the pin C2), before the NMOS device 70 has discharged (a condition indicated by logic 0 on the pin C1). The signal is fed into the refresh counter 36, and causes the refresh counter value to be lowered, as described above.

Figure 6:
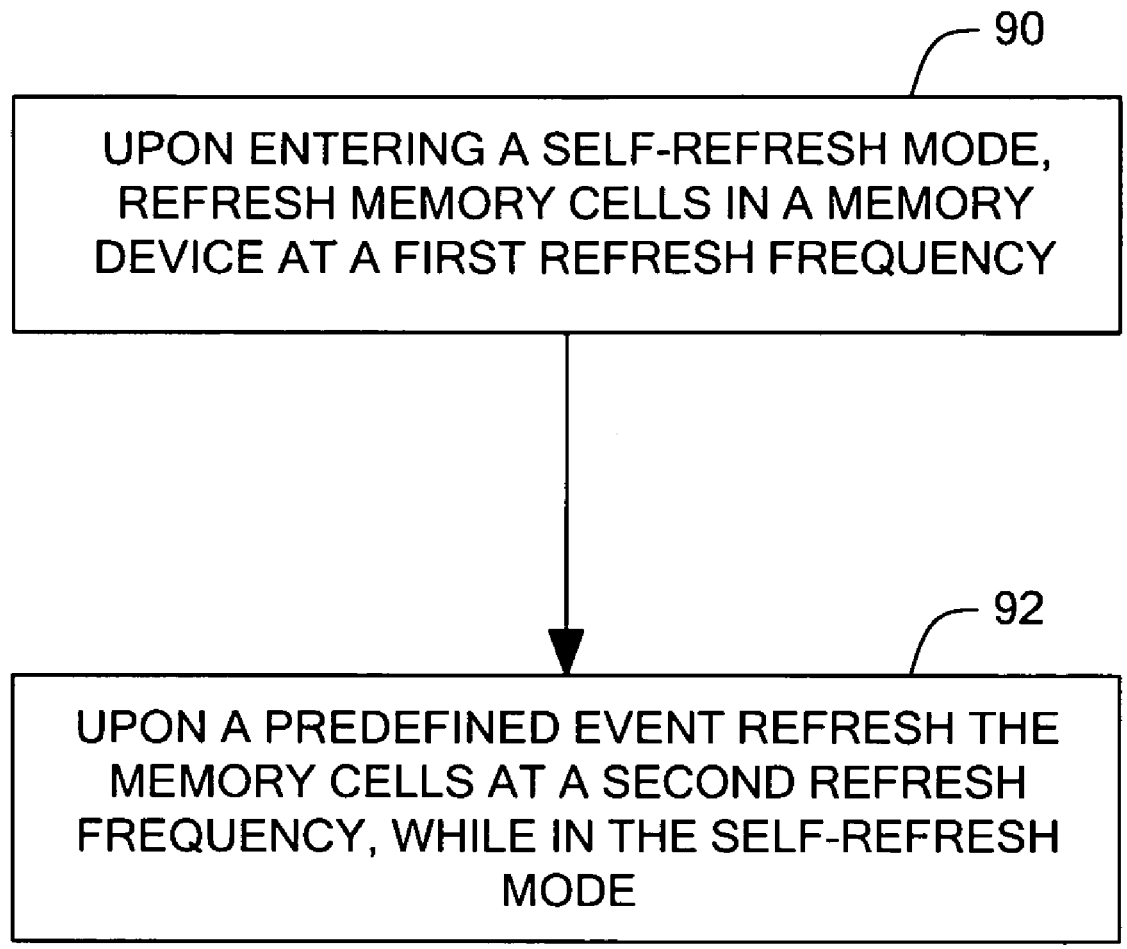

In one embodiment, the memory device 14 may be seen to perform the operations illustrated in FIG. 6 of the drawings. Referring to FIG. 6, at block 90, upon entering a self-refresh mode, the memory cells of the memory device 14 are refreshed at a first refresh frequency. Thereafter, at block 92, after a predefined event the memory cells are refreshed at a second refresh frequency, while in the self-refresh mode. The second refresh frequency is less than the first refresh frequency and the method may include sending a control signal from the memory controller 18 to the memory device 14 to program the first refresh frequency into the memory device 14. Regarding the programming of the first refresh frequency into the memory device 14, it will be appreciated that when the memory controller 18 programs the mode register 40 with the counter value for the refresh counter 36, the memory controller 18 is effectively programming the refresh frequency since the refresh frequency is related to the counter value which represents an interval or period between refresh signals generated by the self-refresh logic 34. As described, the predefined event may comprise a predefined time after entry into the self-refresh mode. In other embodiments, the predefined event may comprise a change in a temperature of the memory device 14. As described, the change in the temperature of the memory device 14 is detected by the temperature sensor 16, in accordance with an embodiment of the invention.

Figure 7:
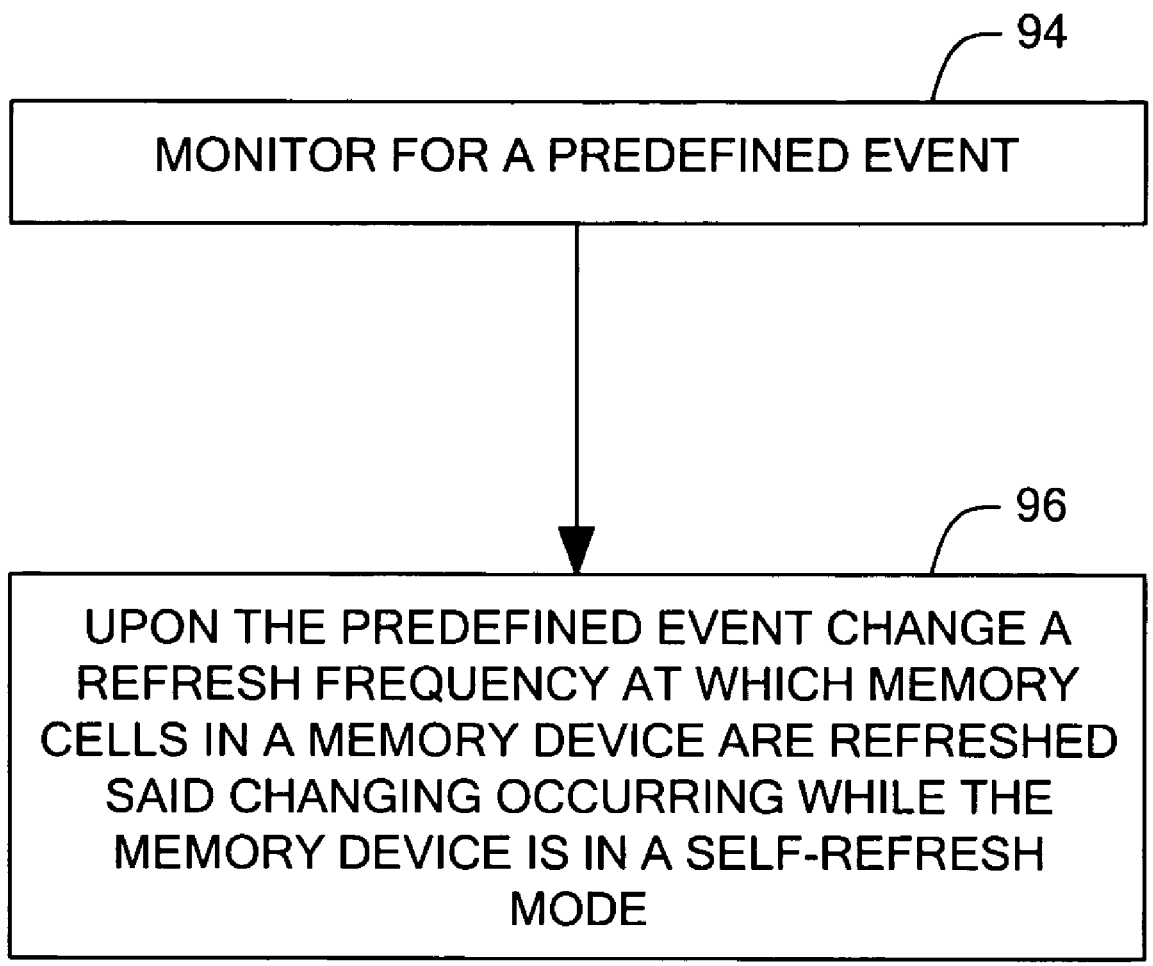

In another sense, in one embodiment, the invention may be viewed in terms of the flowchart of FIG. 7 of the drawings. According to FIG. 7 at block 94, the memory device 14 monitors for a predefined event, and at block 96, upon the predefined event the memory device 14 change the refresh frequency at which memory cells in the memory device 14 are refreshed. The changing of the refresh frequency occurs while the memory device 14 is in the self-refresh mode. As described above, the predefined event may comprise a drop in the temperature of the memory device 14, or an effluxion of a predefined time period after entry into the self-refresh mode. The predefined event may be a change in a temperature of the memory device. The first refresh frequency may be twice the second refresh frequency.

During development, a design may go through various stages, from creation to simulation to fabrication. Data representing a design may represent the design in a number of manners. First, as is useful in simulations, the hardware may be represented using a hardware description language or functional description language. Additionally, a circuit-level model with logic/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine-readable medium. Any optical or electrical wave modulated or otherwise generated to transform such information, a memory, or a magnetic or optical storage such as a disc may be the computer-readable medium. Any of these mediums may "carry" or "indicate" the design or software information. When an electrical carrier wave indicating or carrying the code or design is transmitted, to the extent that copying, buffering or retransmission of the electrical signal is performed, a new copy is made. Thus, a communication provider or a network provider may make copies of an article (carrier wave) embodying techniques of the present invention.

While certain exemplary embodiments have been described and shown in the accompanying drawings, it is to be understood that such embodiments are merely illustrative and not restrictive of the broad invention and that this invention is not limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principals of the present disclosure or the scope of the accompanying claims.

What is claimed is:

1. An apparatus comprising:
    a memory array including a plurality of memory cells;
    a temperature sensing device coupled to the memory array for monitoring the temperature associated with the memory array; and
    logic, coupled to the memory array, configured to dynamically change a refresh frequency at which the memory cells are refreshed during a self refresh mode, wherein the change in the refresh frequency depends on whether the temperature associated with the memory array has exceeded a threshold temperature, wherein the temperature sensing device includes a first transistor and the temperature monitoring of the memory array is done by using charge accumulation on the first transistor.

2. The apparatus of claim 1 wherein the temperature sensing device is a thermal sensor.

3. The apparatus of claim 1 wherein the plurality of memory cells are DRAM cells.

4. The apparatus of claim 1 wherein the temperature sensing device and the memory array with the plurality of memory cells are on a same die.

5. The apparatus of claim 1 wherein the logic has an algorithm that automatically doubles the refresh frequency if the temperature of the memory array exceeds the threshold temperature.

6. An apparatus comprising:
a memory module Including
- a memory array including a plurality of volatile memory cells;
- a temperature sensing device attached to the memory array for monitoring the temperature associated with the memory array; and
- logic, coupled to the memory array, configured to dynamically change a refresh frequency at which the volatile memory cells are refreshed during a self refresh mode, wherein the change in the refresh frequency depends on whether or not the temperature associated with the memory array has exceeded a threshold temperature, wherein the temperature sensing device includes a single transistor and the temperature monitoring of the memory array is done by using charge accumulation on the single transistor.

7. The apparatus of claim 6 wherein the temperature sensing device is a thermal sensor.

8. The apparatus of claim 7 wherein the plurality of volatile memory cells are a DRAM cells.

9. The apparatus of claim 6 wherein the temperature sensing device and the memory array with the plurality of volatile memory cells are on a same die within the memory module.

10. The apparatus of claim 6 wherein the logic has an algorithm that doubles the refresh frequency if the temperature of the memory array exceeds the threshold temperature.

11. A method comprising:
- coupling a temperature sensing device to a memory array including a plurality of volatile memory cells;
- monitoring a temperature associated with a memory array that includes a plurality of volatile memory cells;
- monitoring the temperature associated with the memory array through charge accumulation on a transistor based device; and
- dynamically changing a refresh frequency at which the volatile memory cells are refreshed during a self refresh mode, wherein the change in the refresh frequency depends on a detected temperature associated with the memory array and a threshold temperature value.

12. The method of claim 11, further comprising:
at least doubling the refresh frequency if the temperature of the memory array exceeds the threshold temperature.

13. A system, comprising:
a memory module comprising
- at least one memory device, the memory device including a memory array comprising volatile memory cells;
- a temperature sensing device attached to the memory array for detecting the temperature associated with the memory array; and
- logic, coupled to the memory array, configured to change a refresh frequency at which the volatile memory cells are refreshed during a self refresh mode, wherein the change in the refresh frequency depends on at least whether the temperature associated with the memory array has exceeded a threshold temperature;

a memory controller coupled to the memory module; and
a network interface associated with the memory module to allow the system to communicate with a network, wherein the temperature sensing device includes a first transistor and the temperature monitoring of the memory array is done by using charge accumulation on the first transistor.

14. The system of claim 13 wherein the temperature sensing device is a thermal sensor and the volatile memory cells are DRAM cells.

15. The system of claim 14 wherein the temperature sensing device and the memory array with a plurality of DRAM cells are on the same die.

16. The system of claim 13 wherein the logic has an algorithm that at least doubles the refresh frequency if the temperature of the memory array exceeds the threshold temperature.

* * * * *